(12) United States Patent
Shim et al.

(10) Patent No.: US 9,664,966 B2
(45) Date of Patent: May 30, 2017

(54) DISPLAY DEVICE AND METHOD OF MANUFACTURING THE SAME

(71) Applicant: Samsung Display Co., Ltd., Yongin (KR)

(72) Inventors: SeungBo Shim, Asan-si (KR); Jeong Won Kim, Seoul (KR); Kwangwoo Park, Hwaseong-si (KR); Jinho Ju, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/683,698

(22) Filed: Apr. 10, 2015

(65) Prior Publication Data

US 2016/0048067 A1 Feb. 18, 2016

(30) Foreign Application Priority Data

Aug. 12, 2014 (KR) .................. 10-2014-0104556

(51) Int. Cl.
*H01L 27/12* (2006.01)
*G02F 1/1362* (2006.01)
*H01L 29/66* (2006.01)
*H01L 29/786* (2006.01)

(52) U.S. Cl.
CPC ...... *G02F 1/136209* (2013.01); *H01L 27/124* (2013.01); *H01L 27/1288* (2013.01); *H01L 29/66765* (2013.01); *H01L 29/78669* (2013.01); *G02F 1/136227* (2013.01); *G02F 2001/136222* (2013.01); *G02F 2001/136231* (2013.01); *G02F 2001/136295* (2013.01)

(58) Field of Classification Search
None
See application file for complete search history.

(56) References Cited

U.S. PATENT DOCUMENTS

| 2004/0109101 | A1* | 6/2004 | Kim | .................. G02F 1/136209 349/44 |
| 2014/0055690 | A1* | 2/2014 | Song | .................. G02F 1/13338 349/12 |
| 2015/0153600 | A1* | 6/2015 | Won | ...................... H01L 27/127 349/43 |

FOREIGN PATENT DOCUMENTS

| JP | 2000-162643 | 6/2000 |
| KR | 10-0268105 | 7/2000 |
| KR | 10-0779425 | 11/2007 |

(Continued)

*Primary Examiner* — Charles Garber
*Assistant Examiner* — Alia Sabur
(74) *Attorney, Agent, or Firm* — H.C. Park & Associates, PLC

(57) ABSTRACT

A method of manufacturing a display device, the method including: forming, on a first surface of a substrate, a gate line and a gate electrode; forming a first dielectric layer on the gate line and the gate electrode; forming a data line, a source electrode and a drain electrode on the first dielectric layer; forming a black matrix layer on the first dielectric layer, the data line, the source electrode, and the drain electrode; radiating ultraviolet light on a second surface of the substrate opposing the first surface, the ultraviolet light developing exposed parts of the black matrix layer to form a black matrix pattern; and etching the first dielectric layer using the black matrix pattern as an etching mask to respectively form a first dielectric pattern on the gate line and a gate dielectric pattern on the gate electrode.

9 Claims, 20 Drawing Sheets

(56) References Cited

FOREIGN PATENT DOCUMENTS

| | | |
|---|---|---|
| KR | 10-1169079 | 7/2012 |
| KR | 10-1212554 | 12/2012 |

\* cited by examiner

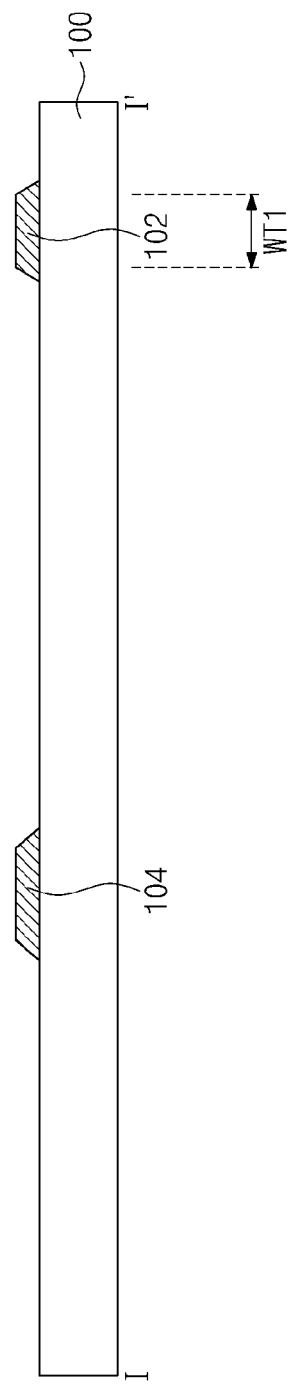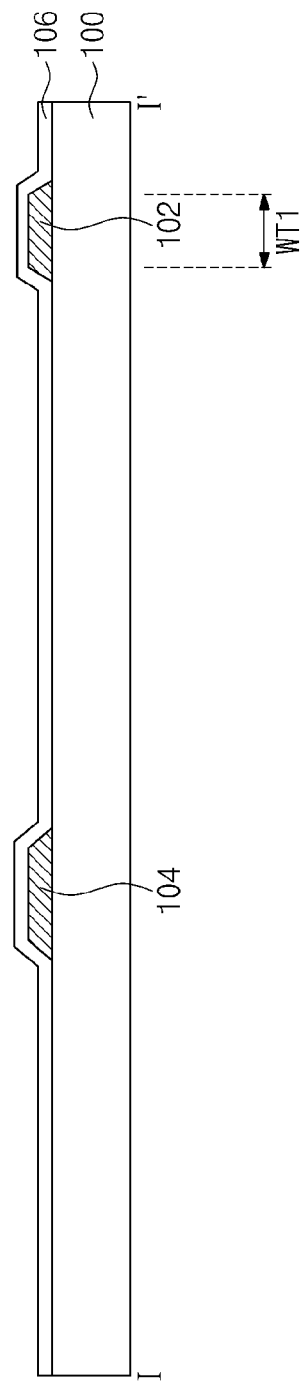

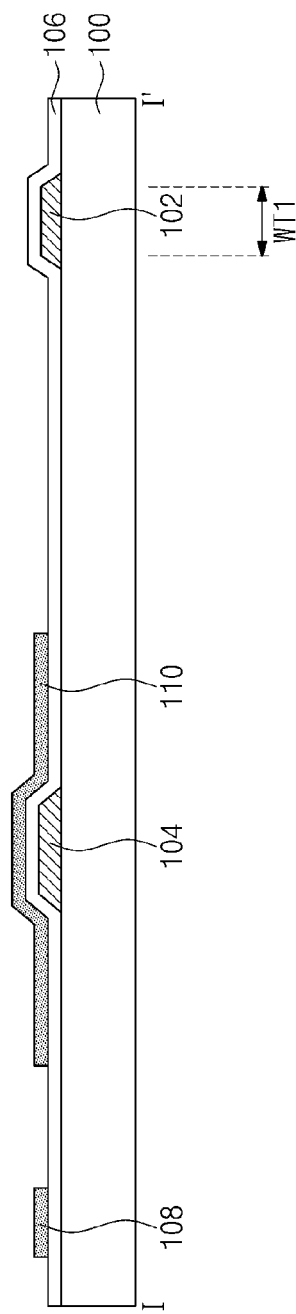
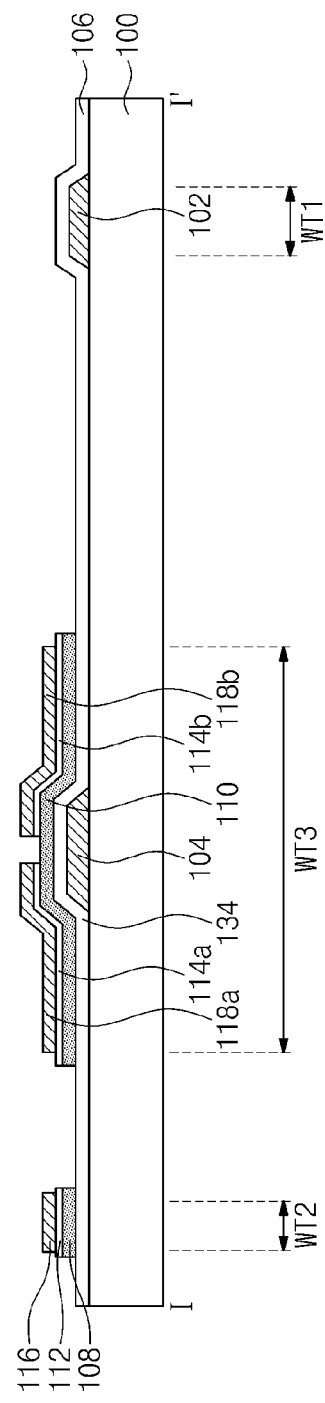

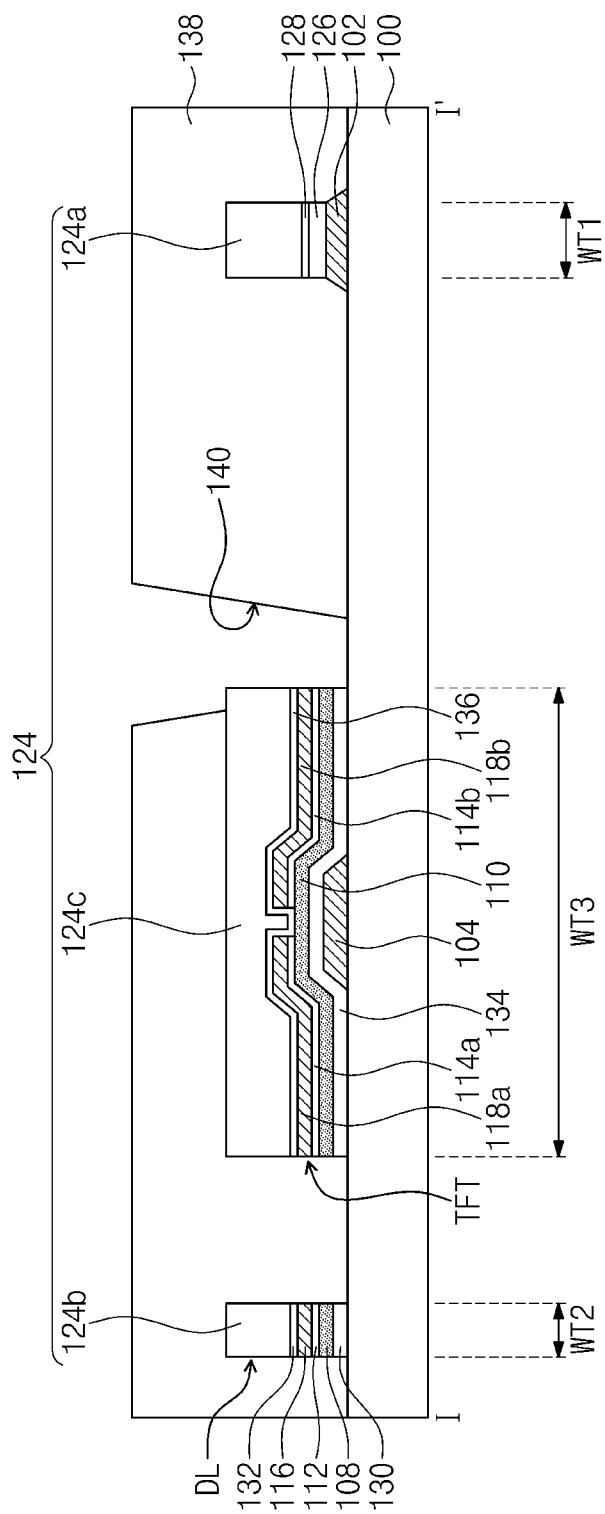

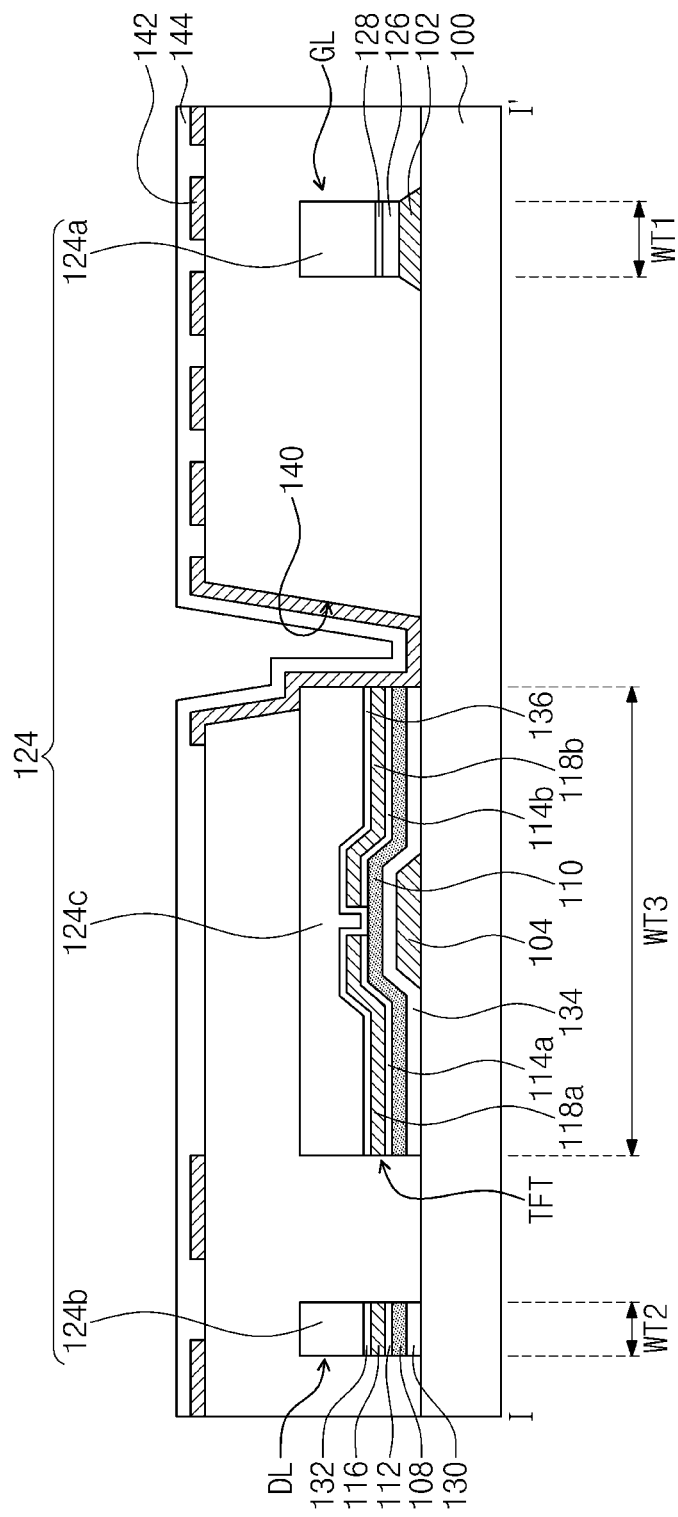

DISPLAY DEVICE AND METHOD OF MANUFACTURING THE SAME

CROSS-REFERENCE TO RELATED APPLICATIONS

This application claims priority from and the benefit of Korean Patent Application No. 10-2014-0104556, filed on Aug. 12, 2014, which is hereby incorporated by reference for all purposes as if fully set forth herein.

BACKGROUND

Field

Exemplary embodiments relate to a display device and a manufacturing method thereof, and, more particularly, to a display device including a black matrix pattern and a manufacturing method thereof.

Discussion

A display device includes an array substrate on which a thin film transistor, a data line, a gate line, and a pixel electrode are disposed, an opposing substrate with a common electrode disposed thereon, and a liquid crystal layer disposed between the array substrate and the opposing substrate. The thin film transistor provided on the array substrate includes a gate dielectric layer made of silicon nitride. Also, a passivation layer made of silicon nitride may be further provided on the thin film transistor. Light generated from the bottom of the array substrate may be partially reflected by the gate dielectric layer and the passivation layer, and, thus, light transmittance may be reduced.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device with improved transmittance.

Exemplary embodiments provide a method of manufacturing the display device with improved transmittance.

Additional aspects will be set forth in the detailed description which follows, and, in part, will be apparent from the disclosure, or may be learned by practice of the inventive concept.

An exemplary embodiment of the present inventive concept discloses a method of manufacturing a display device, the method including: forming, on a first surface of a substrate, a gate line and a gate electrode; forming a first dielectric layer on the gate line and the gate electrode; forming a data line, a source electrode and a drain electrode on the first dielectric layer; forming a black matrix layer on the first dielectric layer, the data line, the source electrode, and the drain electrode; radiating ultraviolet light on a second surface of the substrate opposing the first surface, the ultraviolet light developing exposed parts of the black matrix layer to form a black matrix pattern; and etching the first dielectric layer using the black matrix pattern as an etching mask to respectively form a first dielectric pattern on the gate line and a gate dielectric pattern on the gate electrode.

An exemplary embodiment of the present inventive concept also discloses a display device including: a gate line structure disposed on a substrate, the gate line structure including a gate line and a first dielectric pattern sequentially stacked on the substrate; a data line structure disposed on the substrate, the data line structure including a first dielectric pattern, a first conductive pattern, and a data line sequentially stacked on the substrate; a thin film transistor disposed on the substrate, the thin film transistor including a gate electrode, a gate dielectric pattern, and an active pattern sequentially stacked on the substrate, the thin film transistor further including source and drain electrodes disposed on the active pattern; and a black matrix pattern including a first region disposed on the gate line structure, a second region disposed on the data line structure, and a third region disposed on the thin film transistor.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIGS. 5A, 5B, 5C, 5D, 5E, 5F, 5G, 5H, 5I, 5J, 5K, 5L, 5M, 5N, 5O, 5P, 5Q, and 5R are sectional views of a display device at various stages of manufacture, according to exemplary embodiments.

DETAILED DESCRIPTION OF THE ILLUSTRATED EMBODIMENTS

Figure 1A:
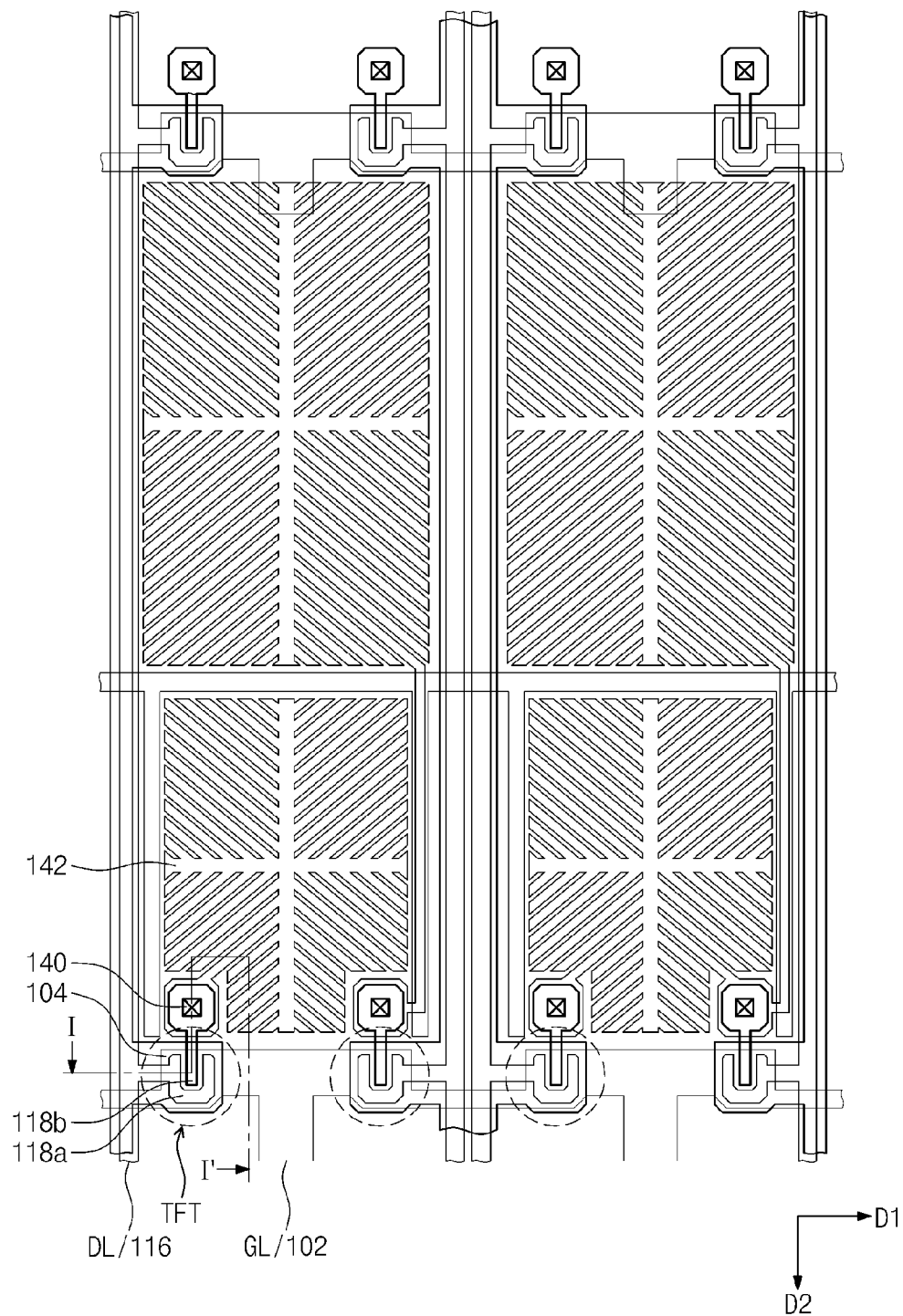
FIG. 1A is a plan view illustrating a display device, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
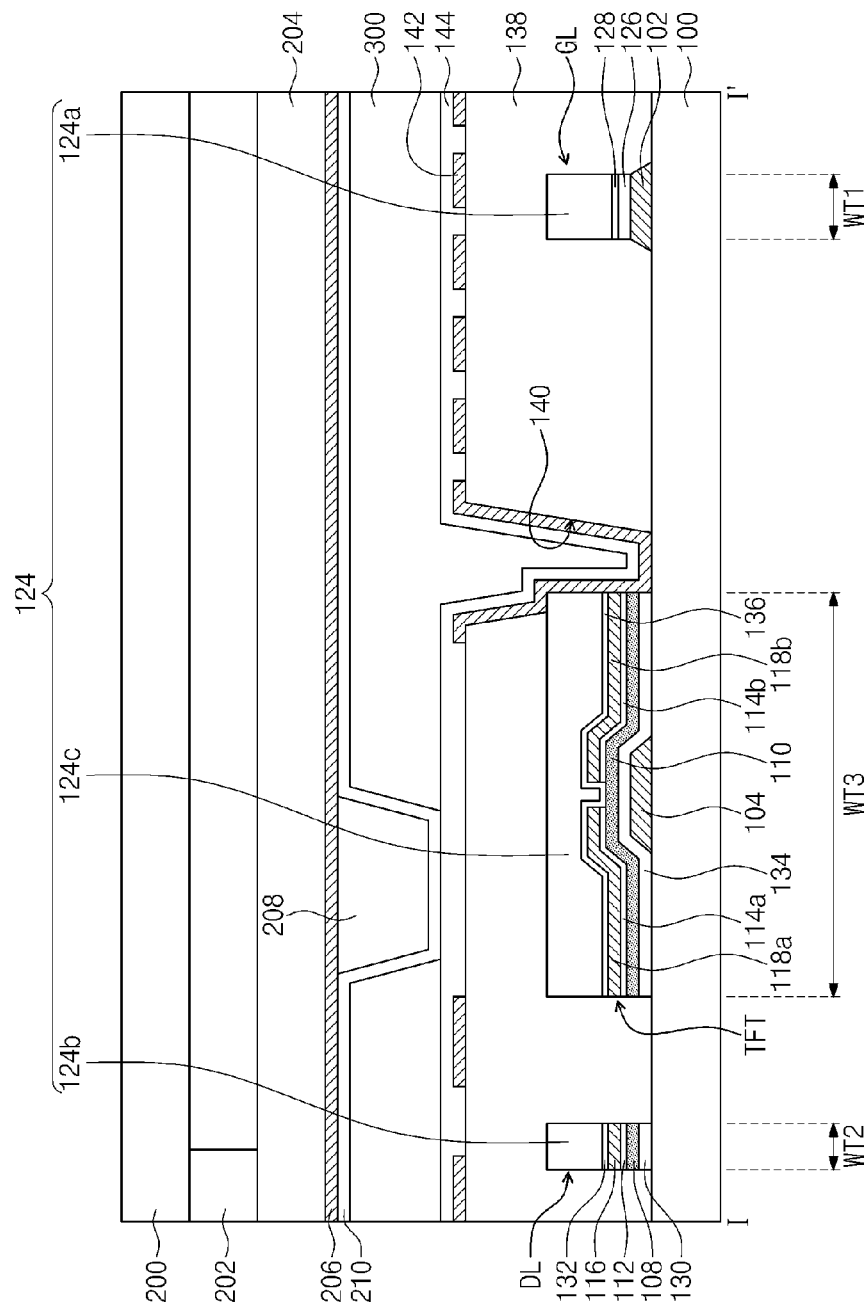
FIG. 1B is a sectional view of the display device of FIG. 1A taken along sectional line I-I', according to exemplary embodiments.

FIG. 1A is a plan view illustrating a display device, according to exemplary embodiments. FIG. 1B is a sectional view of the display device of FIG. 1A taken along sectional line I-I', according to exemplary embodiments.

Referring to FIGS. 1A and 1B, the display device includes a first substrate 100, a second substrate 200 disposed facing the first substrate 100, and a liquid crystal layer 300 disposed between the first and the second substrates 100 and 200. The first substrate 100 is provided with a gate line structure GL, a data line structure DL, a thin film transistor TFT, a pixel electrode 142, and a black matrix pattern 124. The first substrate 100 may be a transparent substrate. The first substrate 100 includes a first surface and a second surface opposing the first surface. The gate line structure GL, the data line structure DL, the thin film transistor TFT, the pixel electrode 142, and the black matrix pattern 124 are disposed on the first surface of the first substrate 100.

The gate line structure GL may include a gate line 102 and a first dielectric pattern 126, which extend in a first direction D1, and are sequentially stacked. According to exemplary embodiments, the gate line structure GL may further include a second dielectric pattern 128 disposed on the first dielectric pattern 126. Referring to FIG. 1B, the gate line 102 has a inclined side so that the width thereof is gradually reduced from bottom to top, and the gate line 102 has a first width WT1 at the top thereof. The first dielectric pattern 126 and the second dielectric pattern 128 may have substantially the same width as the first width WT1.

The data line structure DL includes a data line 116 extending in a second direction D2 perpendicular to the first direction D1, a first dielectric pattern 130, and a first conductive pattern 108. The first dielectric pattern 130 and the first conductive pattern 108 are disposed between the first substrate 100 and the data line 116. According to exemplary embodiments, the data line structure DL may further include a second conductive pattern 112 disposed between the first conductive pattern 108 and the data line 116, and a second dielectric pattern 132 disposed on the data line 116. Referring to FIG. 1B, the first dielectric pattern 130, the first conductive pattern 108, the second conductive pattern 112, and the data line 116 may have substantially the same width, e.g., a second width WT2.

Referring to FIG. 1A, a pixel region may be defined by two adjacent gate lines 102 and two adjacent data lines 116. The pixel electrode 142 is provided in the pixel region. The pixel region may be divided into a plurality of domains, and a plurality of micro slits may be provided in the pixel electrode 142.

The thin film transistor TFT is electrically connected with each of the gate line 102 and the data line 116, and supplies a signal to the pixel electrode 142 by switching. The thin film transistor TFT includes a gate electrode 104 branched from the gate line 102, a source electrode 118*a* branched from the data line 116, and a drain electrode 118*b* electrically connected with the pixel electrode 142. The thin film transistor TFT may further includes an active pattern (semiconductor pattern) 110 disposed between the gate electrode 104 and the source and drain electrodes 118*a* and 118*b*, and a gate dielectric pattern 134 disposed between the active pattern 110 and the gate electrode 104.

The first dielectric patterns 126 of the gate line structure GL, the first dielectric patterns 130 of the data line structure DL, and the gate dielectric pattern 134 may include at least one of a silicon nitride (SiNx), an oxide, and an oxynitride, but any other suitable material may be utilized in association with exemplary embodiments described herein. The second dielectric pattern 128 of the gate line structure GL, the second dielectric pattern 132 of the data line structure DL, and the passivation pattern 136 may include silicon nitride; however, any other suitable material may be utilized in association with exemplary embodiments described herein.

Referring to FIG. 1B, the gate electrode 104 may have an inclined side so that the width thereof may be gradually reduced from bottom to top. The gate dielectric pattern 134 extends along the top and side of the gate electrode 104 to cover at least a portion of the surface of the first substrate 100. A straight-line distance between both ends of the gate dielectric pattern 134 may be defined as a third width WT3. A straight-line distance between both ends of the active pattern 110 may be substantially equal to the third width WT3.

Referring to FIG. 1B, the source electrode 118a and the drain electrode 118b are disposed spaced apart from each other, facing each other at a central portion of the active pattern 110. The source electrode 118a includes a first end facing the drain electrode 118b and a second end extending to one end of the active pattern 110. The drain electrode 118b includes a first end facing the source electrode 118a and a second end extending to the other end of the active pattern 110. A straight-line distance between the second end of the source electrode 118a and the second end of the drain electrode 118b may be substantially equal to the third width WT3.

According to exemplary embodiments, first and second highly doped silicon patterns 114a and 114b may be further disposed between the active pattern 110 and the source and drain electrodes 118a and 118b, respectively. For example, if the active pattern 110 is doped with n-type impurities, the first and the second highly doped silicon patterns 114a and 114b may be doped with n-type impurities, wherein the first and the second highly doped silicon patterns 114a and 114b may have a doping concentration of the n-type impurities higher than that of the active pattern 110. The first highly doped silicon pattern 114a may be disposed between the active pattern 110 and the source electrode 118a, and the second highly doped silicon pattern 114b may be disposed between the active pattern 110 and the drain electrode 118b. The first highly doped silicon pattern 114a and the second highly doped silicon pattern 114b are disposed spaced apart and facing each other. The first highly doped silicon pattern 114a includes a first end facing the second highly doped silicon pattern 114b and a second end extending to one end of the active pattern 110. The second highly doped silicon pattern 114b includes a first end facing the first highly doped silicon pattern 114a and a second end extending to the other end of the active pattern 110. A straight-line distance between the second end of the first highly doped silicon pattern 114a and the second end of the second highly doped silicon pattern 114b may be substantially equal to the third width WT3.

According to exemplary embodiments, a passivation pattern 136 may be further provided on the source electrode 118a and the drain electrode 118b. Referring to FIG. 1B, a straight-line distance between both ends of the passivation pattern 136 may be substantially equal to the third width WT3.

The black matrix pattern 124 includes a first region 124a, a second region 124b, and a third region 124c. The first region 124a of the black matrix pattern 124 is disposed on the gate line structure GL. Referring to FIG. 1B, the first region 124a of the black matrix pattern 124 may have the first width WT1. The second region 124b of the black matrix pattern 124 is disposed on the data line structure DL. Referring to FIG. 1B, the second region 124b of the black matrix pattern 124 may have substantially the same width as the second width WT2. The third region 124c of the black matrix pattern 124 is disposed on the thin film transistor TFT. Referring to FIG. 1B, a straight-line distance between both ends of the black matrix pattern 124 may be substantially equal to the third width WT3. As such, the first and the second dielectric patterns 126 and 128 of the gate line structure GL are disposed in the portion where the gate line 102 is disposed, the first and the second dielectric patterns 130 and 132 of the data line structure DL are disposed in the portion where the data line 116 is disposed, and the gate dielectric pattern 134 and the passivation pattern 136 are disposed in the portion where the thin film transistor TFT is disposed. Accordingly, the other portions of the first substrate 100 are not covered with a material layer made of, for instance, nitride (or another light blocking material), and, as such, the light transmittance of a display device may be improved.

The first substrate 100 is further provided with an organic layer 138 that covers the gate line structure GL, the data line structure DL, the thin film transistor TFT, and the black matrix pattern 124. According to exemplary embodiments, the organic layer 138 includes a hole 140 in the organic layer 138 exposing at least the second end of the drain electrode 118b. The hole 140 may extend to expose a portion of the first surface of the first substrate 100.

The pixel electrode 142 is disposed on the organic layer 138 having the hole 140. The pixel electrode 142 may be electrically connected with a portion of the drain electrode 118b exposed by the hole 140. The pixel electrode 142 may have a structure having the plurality of micro slits.

Color filters 202, an over coating layer 204, and a common electrode 206 may be disposed on the second substrate 200. The second substrate 200 may be a transparent substrate. The second substrate 200 includes a first surface facing the first substrate 100 and a second surface opposing the first surface. The color filters 202, the over coating layer 204, and the common electrode 206 are disposed on the first surface of the second substrate 200.

The color filters 202 may be disposed to correspond to pixel regions, respectively. The color filters 202 may include a red filter, a blue filter, and a green filter; however, any other or additional colored color filters may be utilized in association with exemplary embodiments described herein. The over coating layer 204 is a layer provided to compensate for step differences between the thicknesses of color filters 202, however, as seen in FIG. 1B, the color filters 202 are shown as having substantially the same thickness for convenience. The common electrode 206 may be disposed on the over coating layer 204 having a homogeneous surface. The common electrode 206 may be a plate electrode.

Between the first substrate 100 and the second substrate 200, a column spacer 208 may be disposed to secure a space to fill in the liquid crystal layer 300 between the first and the second substrates 100 and 200. The column spacer 208 may be provided in a peripheral region of the pixel region. The display device may further include a first alignment layer 144 disposed between the liquid crystal layer 300 and the pixel electrode 142, and a second alignment layer 210 disposed between the liquid crystal layer 300 and the common electrode 206. The second alignment layer 210 may be disposed between the column spacer 208 and the liquid crystal layer 300.

Herein, a display device having a structure in which the black matrix pattern 124 is disposed on the first substrate 100 used as an array substrate, is referred to as a black-matrix on array (BOA) type display device.

Figure 2:
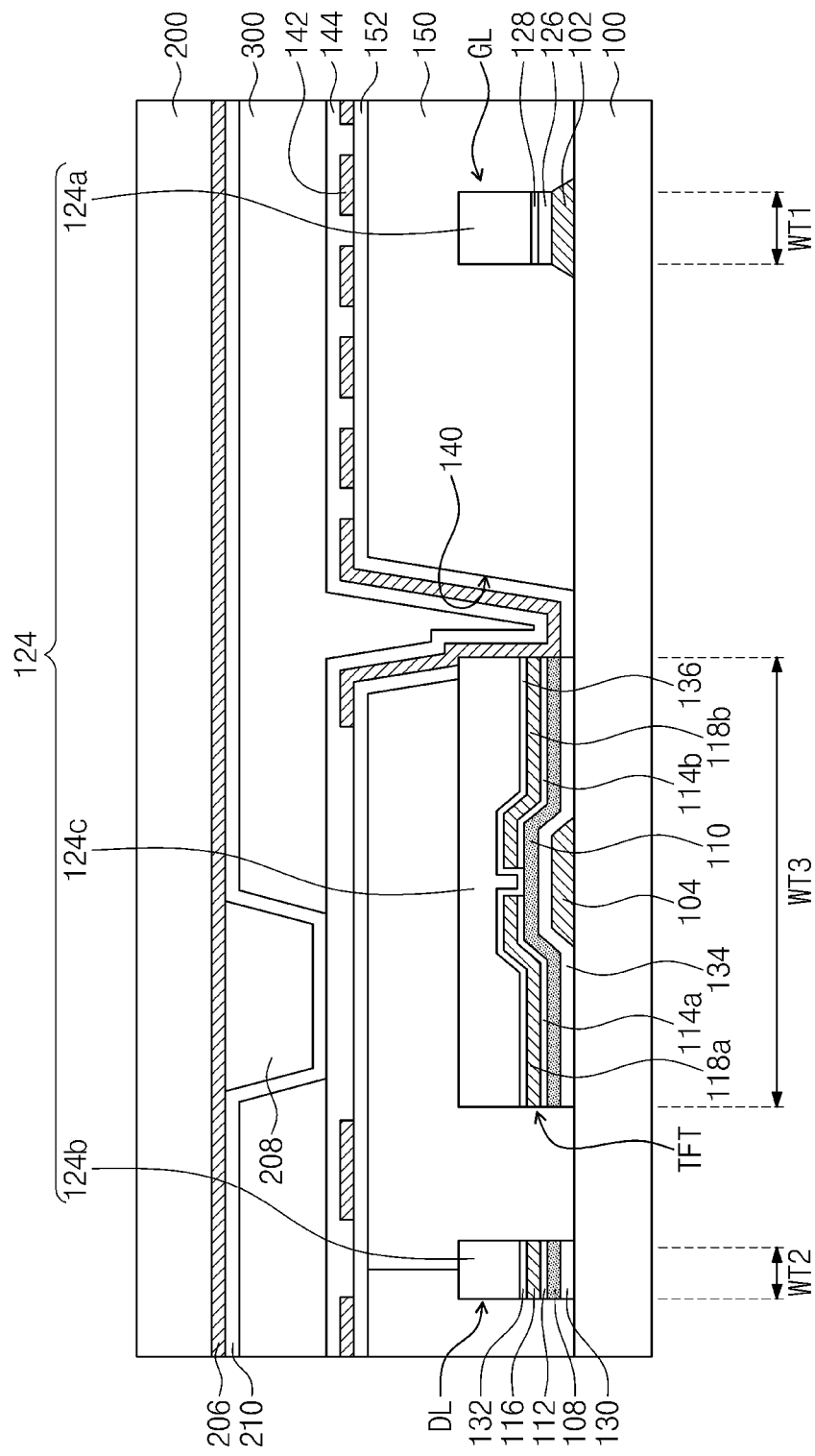
FIG. 2 is a sectional view illustrating a display device, according to exemplary embodiments.

FIG. 2 is a sectional view illustrating a display device, according to exemplary embodiments.

Referring to FIG. 2, the display device includes a first substrate 100, a second substrate 200 disposed facing the first substrate 100, and a liquid crystal layer 300 disposed between the first and the second substrates 100 and 200. The first substrate 100 is provided with a gate line structure GL, a data line structure DL, a thin film transistor TFT, a pixel electrode 142, a black matrix pattern 124, a color filter 150, and a first alignment layer 144.

The color filter 150 may be disposed to cover the first substrate 100 in which the gate line structure GL, the data line structure DL, the thin film transistor TFT, and the black matrix pattern 124 are provided. The color filter 150 may include a red filter, a green filter, and a blue filter; however, any other and/or additional colored color filter may be utilized in association with exemplary embodiments described herein. The color filter 150 is etched to have a hole 140 exposing a drain electrode 118*b*. A capping layer 152 may be further provided between the color filter 150 and the pixel electrode 142. The capping layer 152 may selectively expose the drain electrode 118*b*. Furthermore, the capping layer 152 may include a dielectric material, such as silicon nitride; however, any other suitable material may be utilized in association with exemplary embodiments.

A common electrode 206, a column spacer 208, and a second alignment layer 210 may be disposed on the first surface the second substrate 200.

It is noted that the features and components in FIG. 2 are substantially similar to those in FIGS. 1A and 1B, expect for the following differences: a color filter 150 is disposed on the first substrate 100 in place of organic layer 138; a capping layer 152 is disposed between color filter 150 and pixel electrode 142; and the color filter 150 and the over coating layer 204 are not provided in association with second substrate 200. Thus, any further duplicative descriptions have been omitted to avoid obscuring exemplary embodiments described herein. To this end, a display device having a structure in which, instead of organic layer 138, color filters 150 are disposed on the first substrate 100 used as an array substrate, may be referred to as a color-filter on array (COA)-type display device.

Figure 3:
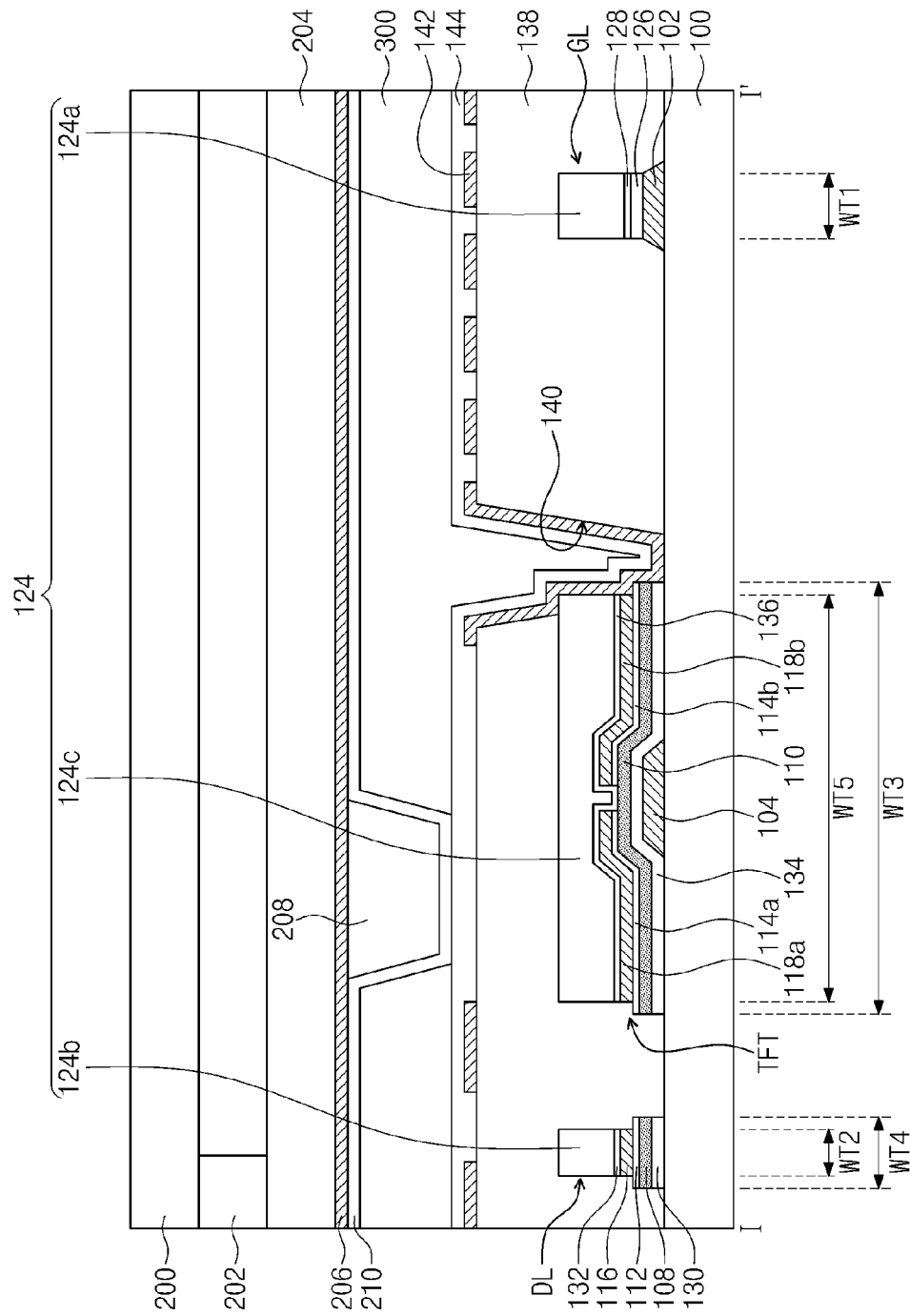
FIG. 3 is a sectional view illustrating a display device, according to exemplary embodiments.

FIG. 3 is a sectional view illustrating a display device, according to exemplary embodiments.

Referring to FIG. 3, the display device includes a first substrate 100, a second substrate 200 disposed facing the first substrate 100, and a liquid crystal layer 300 disposed between the first and the second substrates 100 and 200. The first substrate 100 is provided with a gate line structure GL, a data line structure DL, a thin film transistor TFT, a black matrix pattern 124, an organic layer 138, and a pixel electrode 142.

The gate line structure GL may include a gate line 102, a first dielectric pattern 126, and a second dielectric pattern 128 sequentially stacked. The first dielectric pattern 126 and the second dielectric pattern 128 may have substantially the same width, e.g., a first width WT1. According to exemplary embodiments, the second dielectric pattern 128 may not be omitted.

The data line structure DL may include a first dielectric pattern 130, a first conductive pattern 108, a second conductive pattern 112, a data line 116, and a second dielectric pattern 132 sequentially stacked. The data line 116 and the second dielectric pattern 132 may have substantially the same width, e.g., a second width WT2. The first dielectric pattern 130 and the first and second conductive patterns 108 and 112 may have substantially the same width, e.g., a fourth width WT4, which is greater than the second width WT2. Therefore, at least a part of a top surface of the second conductive pattern 112 may be exposed at side edges thereof. In exemplary embodiments, the second conductive pattern 112 and the second dielectric pattern 132 may be omitted.

The thin film transistor TFT may include a gate electrode 104, a gate dielectric pattern 134, an active pattern 110, first and second highly doped silicon patterns 114*a* and 114*b*, a source electrode 118*a*, a drain electrode 118*b*, and a passivation pattern 136. A straight-line distance between a second end of the source electrode 118*a* and a second end of the drain electrode 118*b* may be substantially equal to a straight-line distance between both ends of the passivation pattern 136, e.g., a fifth width WT5. A straight-line distance between both ends of the active pattern 110 may be substantially equal to a straight-line distance between both ends of the gate dielectric pattern 134, e.g., a third width WT3, which is greater than the fifth width WT5. As such, at least part of a top surface of the first highly doped silicon pattern 114*a* and a top surface of the second end of the second highly doped silicon pattern 114*b* may be exposed at side edges thereof. According to exemplary embodiments, the first and the second highly doped silicon patterns 114*a* and 114*b*, and the passivation pattern 136 may be omitted.

The black matrix pattern 124 includes a first region 124*a*, a second region 124*b*, and a third region 124*c*. The first region 124*a* is disposed on the gate line structure GL and has the first width WT1, the second region 124*b* is disposed on the data line structure DL and has the second width WT2, and the third region 124*c* is disposed on the thin film transistor TFT and has the fifth width WT5.

The organic layer 138 has a hole 140 exposing at least the second end of the drain electrode 118*b*. The hole 140 may further expose a side of the third region 124*c* of the black matrix pattern 124, an end of the passivation pattern 136, the second end of the drain electrode 118*b*, the second end and its top surface of the second highly doped silicon pattern 114*b*, the other end of the active pattern 110, and an end of the gate dielectric pattern 134. To this end the hold 140 may also partially expose the first surface of the first substrate 100.

The pixel electrode 142, which is electrically connected with the second end of the drain electrode 118*b*, may be disposed on the organic layer 138 in which the hole 140 is provided.

It is noted that other features and components of FIG. 3 are substantially similar to those in FIGS. 1A and 1B, and, therefore, any further duplicative descriptions have been omitted to avoid obscuring exemplary embodiments described herein. To this end, the display device described in association with FIG. 3 is a BOA-type display device in which black matrix pattern 124 is provided on the array substrate 100. Further, the structural features of the display device of FIG. 3 may be applied similarly to the COA-type display device of FIG. 2. Therefore, to avoid obscuring exemplary embodiments described herein, duplicative descriptions will not be given with respect to a COA-type display device. It is noted, however, that the primary differences would be that, in FIG. 3, the organic layer 138 would be replaced with color filter 150, and a capping layer 152 may be disposed between color filter 150 and the pixel electrode 142, as seen in FIG. 2.

Figure 4:
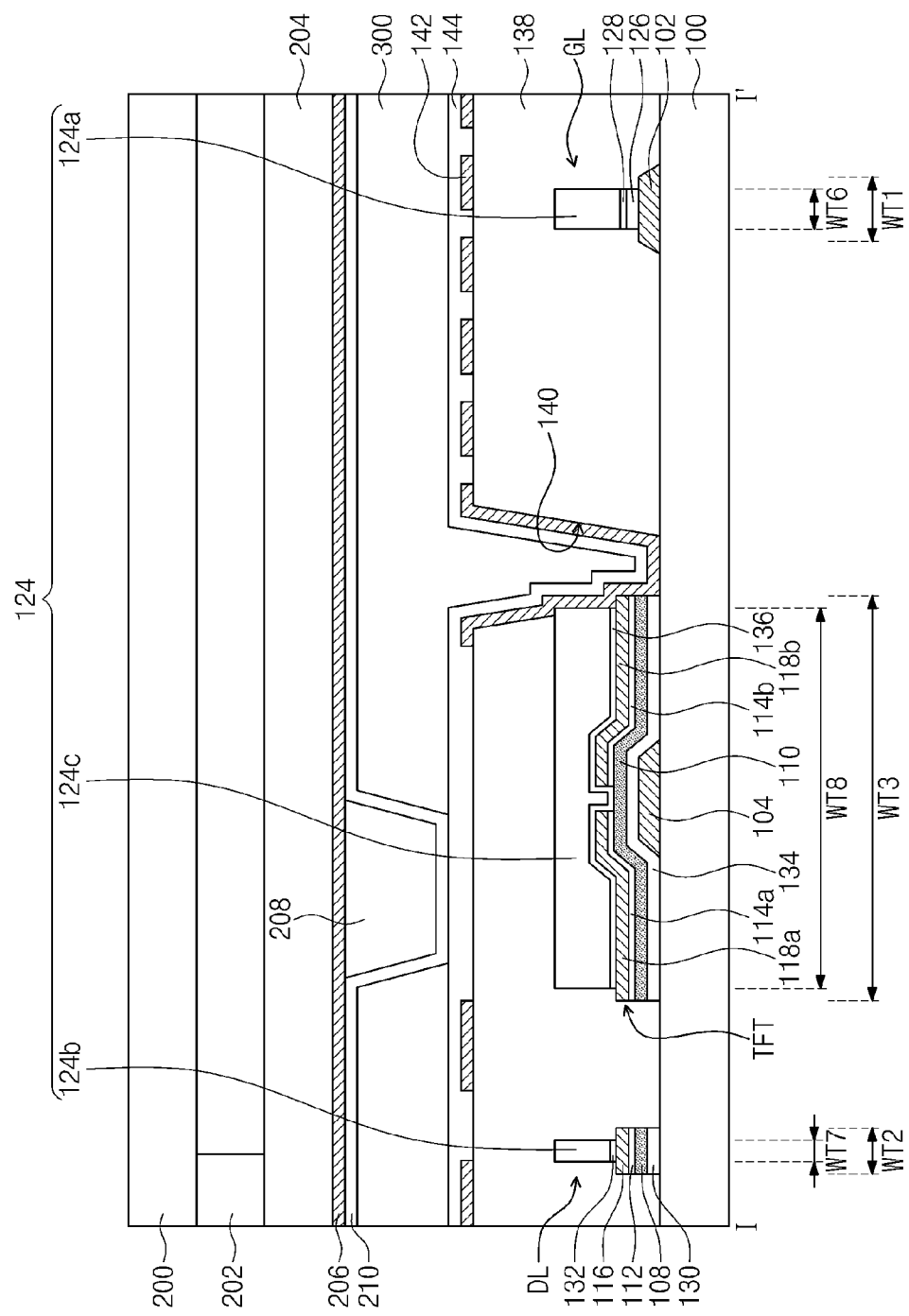
FIG. 4 is a sectional view illustrating a display device, according to exemplary embodiments.

FIG. 4 is a sectional view illustrating a display device, according to exemplary embodiments.

Referring to FIG. 4, the display device includes a first substrate 100, a second substrate 200 facing the first substrate 100, and a liquid crystal layer 300 disposed between the first and the second substrates 100 and 200. The first substrate 100 is provided with a gate line structure GL, a data line structure DL, a thin film transistor TFT, a black matrix pattern 124, an organic layer 138, and a pixel electrode 142.

The gate line structure GL may have a structure in which a gate line 102, a first dielectric pattern 126, and a second dielectric pattern 128 are stacked in sequence. A top portion of the gate line 102 may have a first width WT1. The first dielectric pattern 126 and the second dielectric pattern 128 may have substantially the same width as a sixth width WT6, which is less than the first width WT1. As illustrated in FIG. 4, at least a portion of a top surface of the edge of the gate line 102 may be exposed at side edges thereof. According to exemplary embodiments, the second dielectric pattern 128 may be omitted.

The data line structure DL may include a first dielectric pattern 130, a first conductive pattern 108, a second conductive pattern 112, a data line 116, and a second dielectric pattern 132 sequentially stacked. The first dielectric pattern 130, the first and the second conductive patterns 108 and 112, and the data line 116 may have substantially the same width, e.g., a second width WT2. The second dielectric pattern 132 may have a seventh width WT7, which is less than the second width WT2. As illustrated in FIG. 4, at least a portion of a top surface of the edge of the data line 116 may be exposed at side edges thereof. According to exemplary embodiments, the second conductive pattern 112 and the second dielectric pattern 132 may be omitted.

The thin film transistor TFT may include a gate electrode 104, a gate dielectric pattern 134, an active pattern 110, first and second highly doped silicon patterns 114a and 114b, a source electrode 118a, a drain electrode 118b, and a passivation pattern 136. A straight-line distance between both ends of the active pattern 110 may be substantially equal to a straight-line distance between both ends of the gate dielectric pattern 134, e.g., a third width WT3. A straight-line distance from a second end of the first highly doped silicon pattern 114a to a second end of the second highly doped silicon pattern 114b and a straight-line distance from a second end of the source electrode 118a to a second end of the drain electrode 118b may be substantially equal to the third width WT3. The straight-line distance between both ends of the passivation pattern 136 may have an eight width WT8, which is less than the third width WT3. As such, and as illustrated in FIG. 4, at least a portion of a top surface of the second end of the source electrode 118a and a top surface of the second end of the drain electrode 118b may be exposed at side edges thereof. According to exemplary embodiments, the first and the second highly doped silicon patterns 114a and 114b, and the passivation pattern 136 may be omitted.

The black matrix pattern 124 includes a first region 124a disposed on the gate line structure GL, a second region 124b disposed on the data line structure DL, and a third region 124c disposed on the thin film transistor TFT. The first region 124a of the black matrix pattern 124 may have the sixth width WT6, which is substantially equal to the width of the second dielectric pattern 128 of the gate line structure GL. The second region 124b of the black matrix pattern 124 may have the seventh width WT7, which may be substantially equal to the width of the second dielectric pattern 132 of the data line structure DL. The third region 124c of the black matrix pattern 124 may have the eighth width WT8, which may be substantially equal to the width of the passivation pattern 136 of the thin film transistor TFT.

The organic layer 138 has a hole 140 exposing at least the second end of the drain electrode 118b. The hole 140 may further expose a side of the third region 124c of the black matrix pattern 124, an end of the passivation pattern 136, the second end and its top surface of the drain electrode 118b, the second end of the second highly doped silicon pattern 114b, another end of the active pattern 110, and an end of the gate dielectric pattern 134, as well as partially expose the first surface of the first substrate 100.

The pixel electrode 142 is disposed on the organic layer 138 with hole 140 formed therein. The pixel electrode is electrically connected with the drain electrode 118b. As described above, exposing the second end and its top surface of the drain electrode 118b via hole 140 may result in an increase of a contact area between the pixel electrode 142 and the drain electrode 118b.

The components that are not described in detail in this embodiment are substantially identical to those of the display device described in FIGS. 1A and 1B, and therefore, detailed descriptions that are substantially identical with FIGS. 1A and 1B will be omitted herein. Furthermore, in this embodiment, like reference numerals or symbols are used for like components as denoted in FIGS. 1A and 1B.

FIG. 4 illustrates an exemplary BOA-type display device, in which the black matrix pattern 124 is disposed on the array substrate 100. Further, the structural features of the display device of FIG. 4 may be applied similarly to the COA-type display device of FIG. 2. Therefore, to avoid obscuring exemplary embodiments described herein, duplicative descriptions will not be given with respect to a COA-type display device. It is noted, however, that the primary differences would be that, in FIG. 4, the organic layer 138 would be replaced with color filter 150, and a capping layer 152 may be disposed between color filter 150 and the pixel electrode 142, as seen in FIG. 2.

Figure 5E:
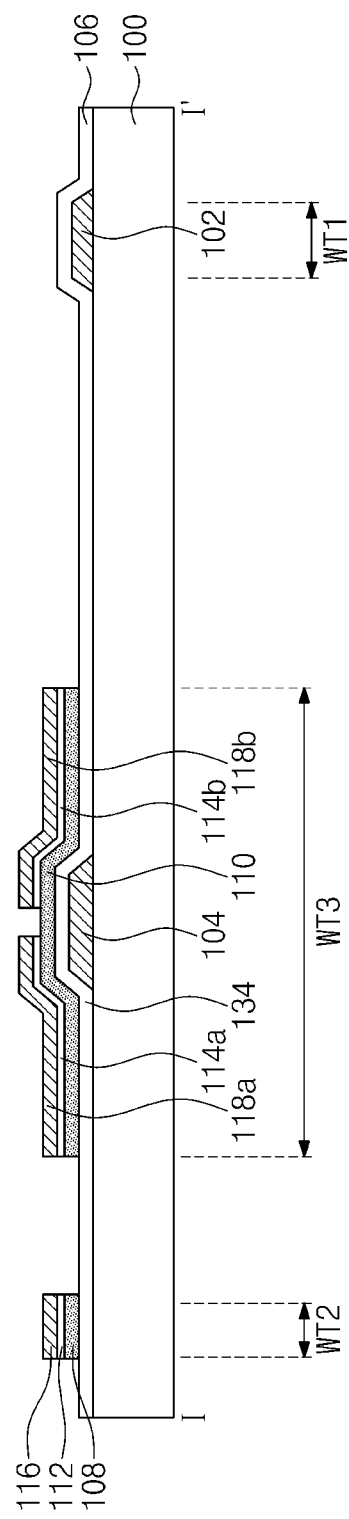
Figure 5F:
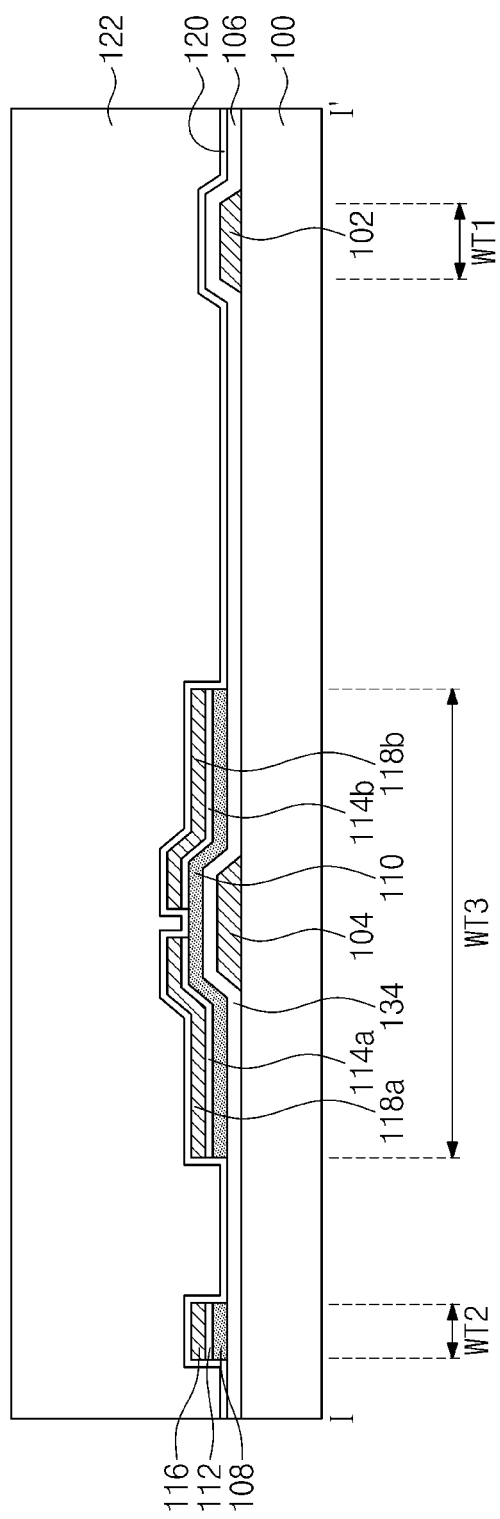
Figure 5G:
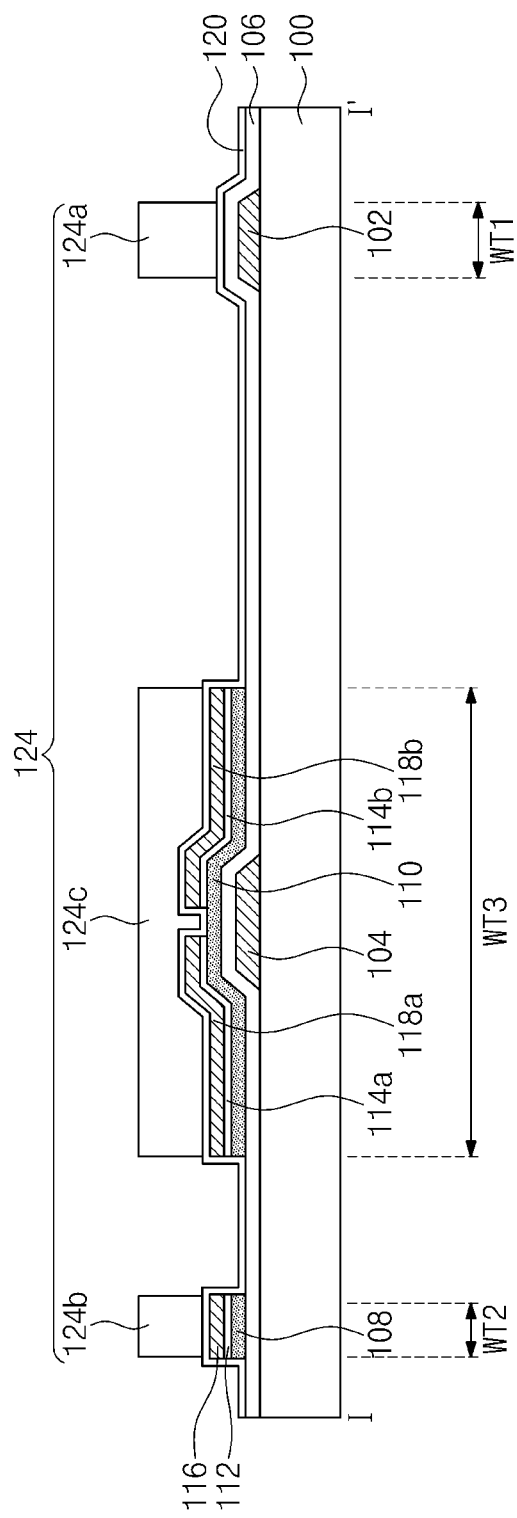
Figure 5H:
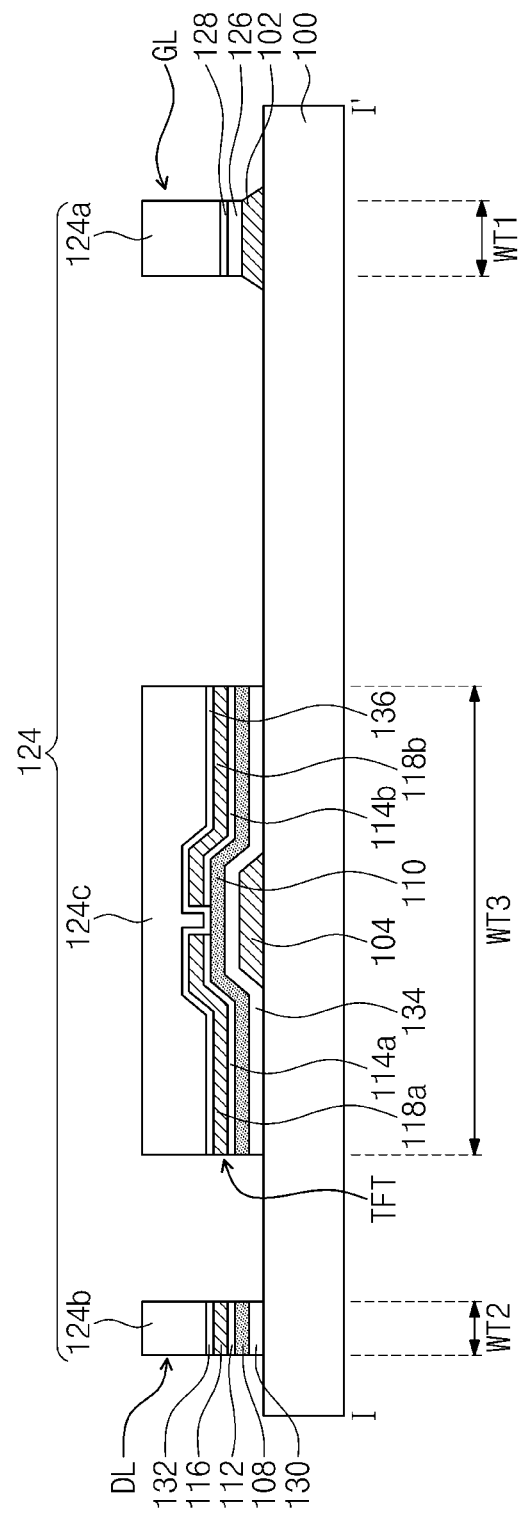
Figure 5I:
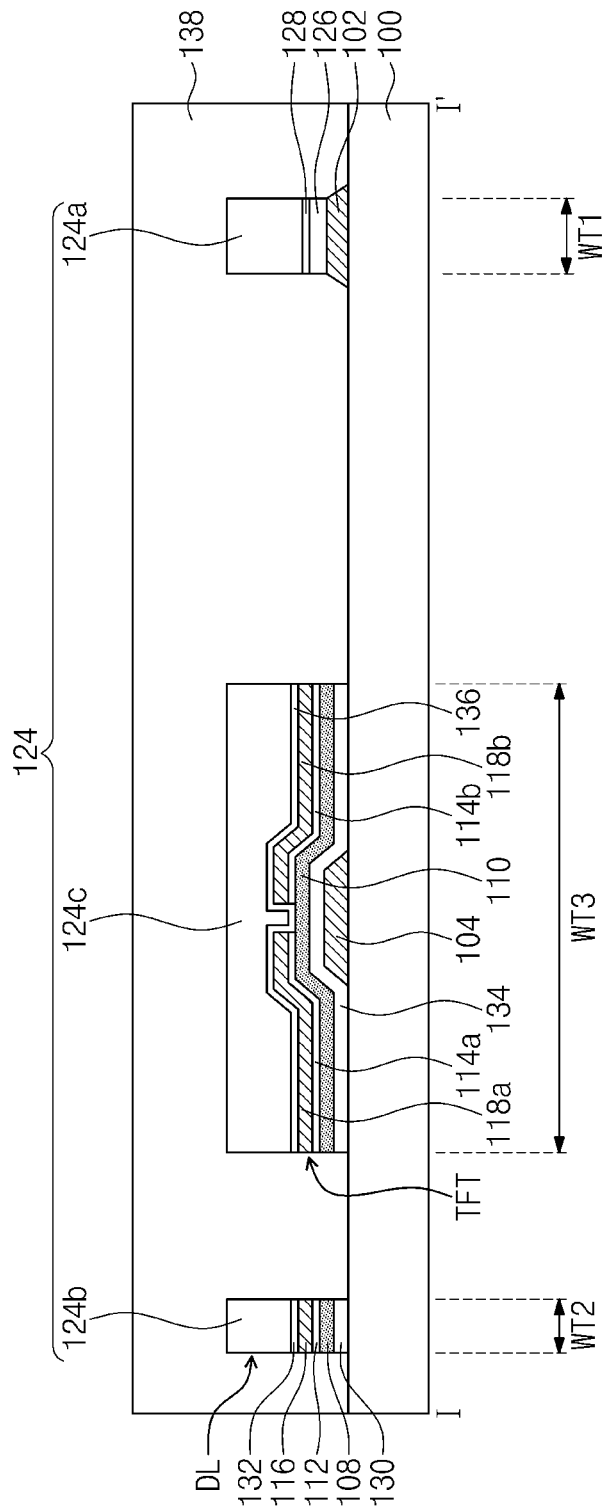
Figure 5K:
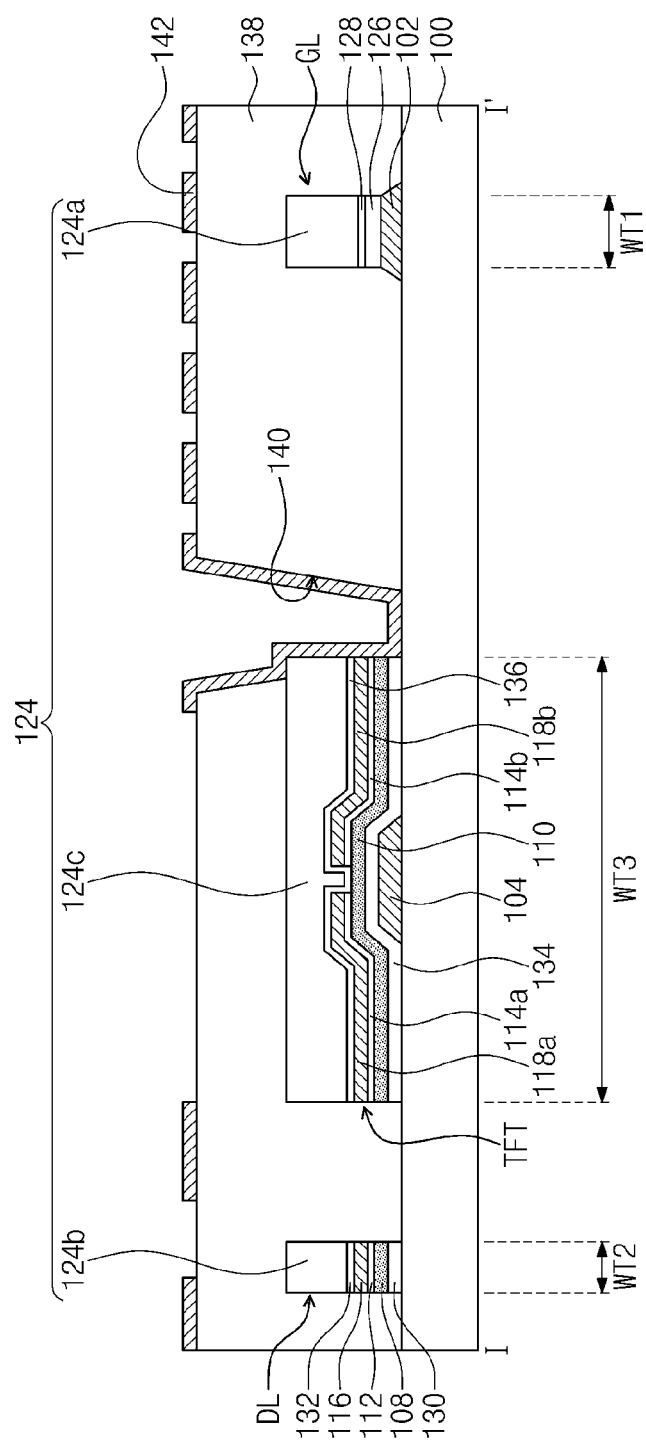
Figure 5M:
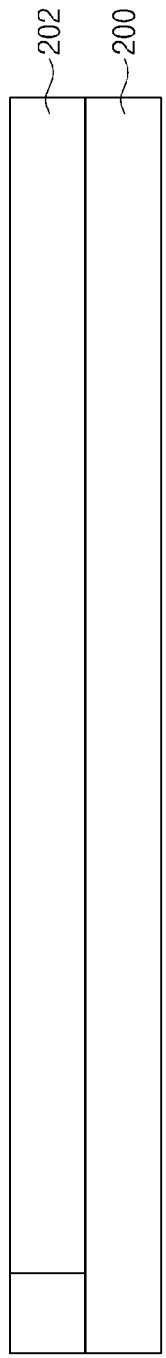
Figure 5N:
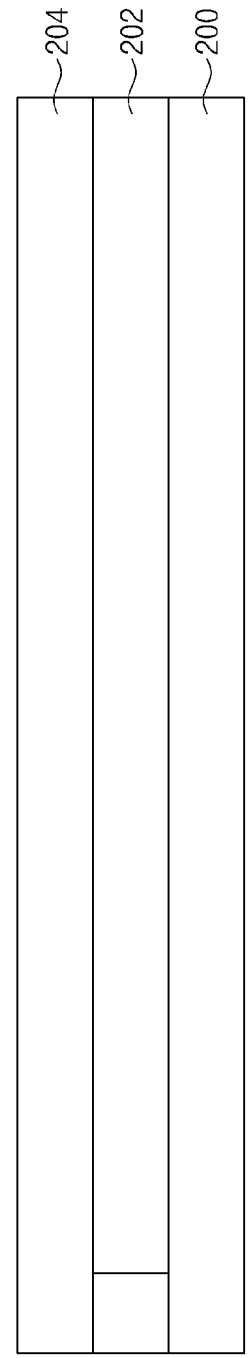
Figure 50:
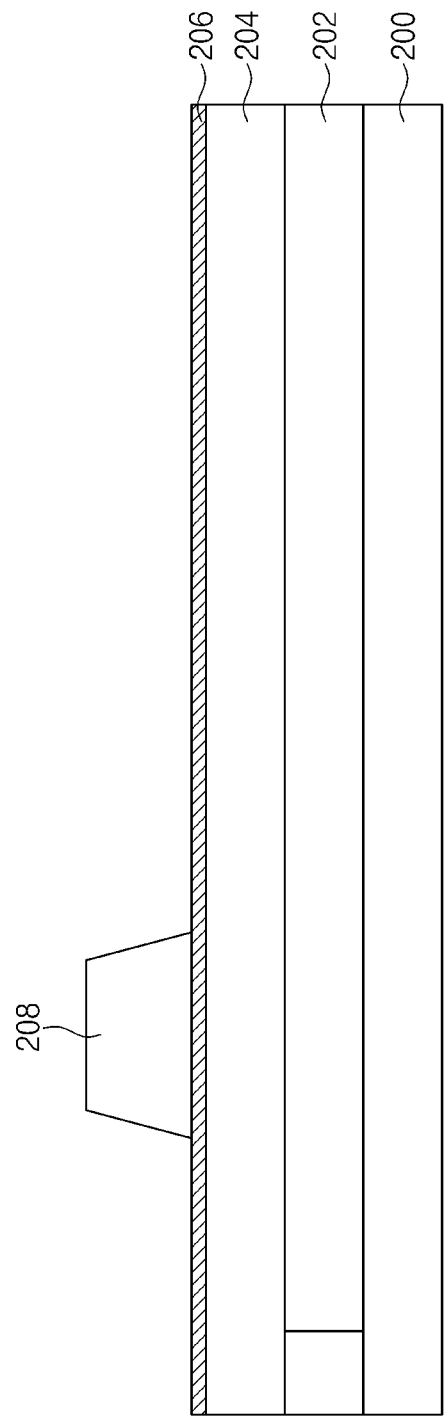
Figure 5P:
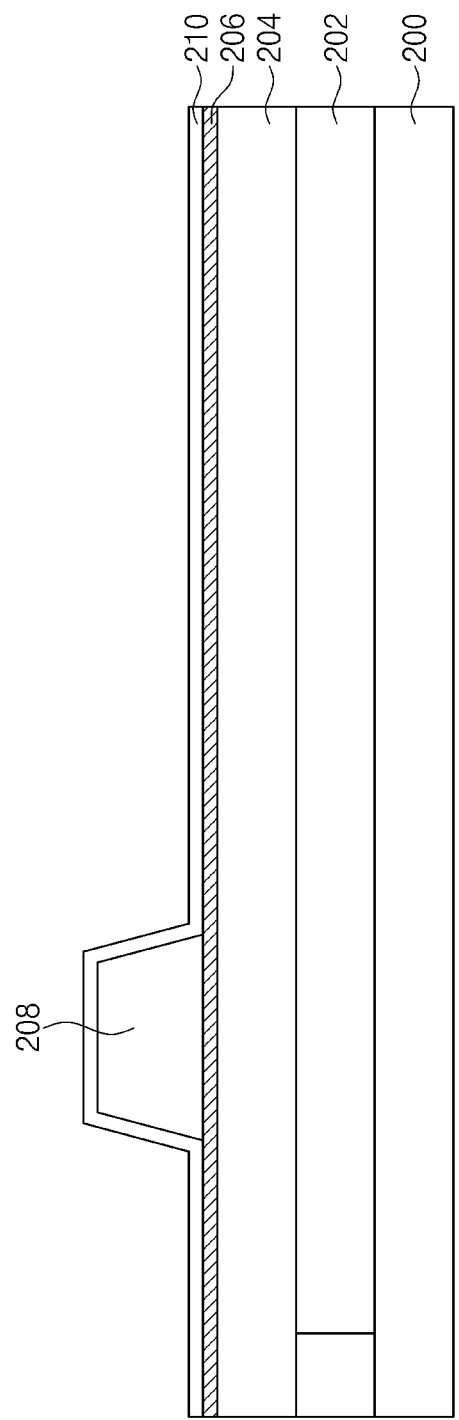
Figure 5Q:
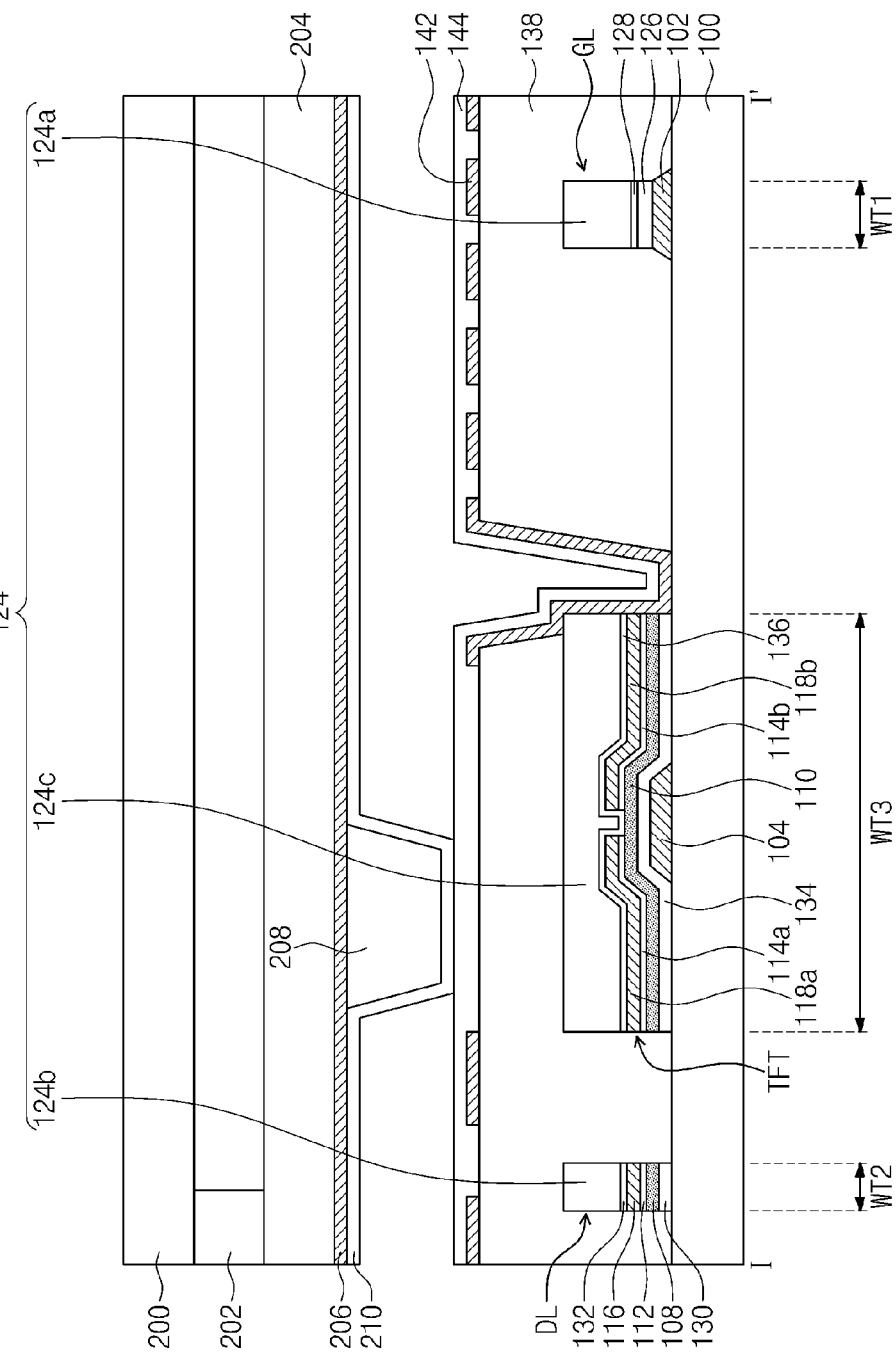
Figure 5R:
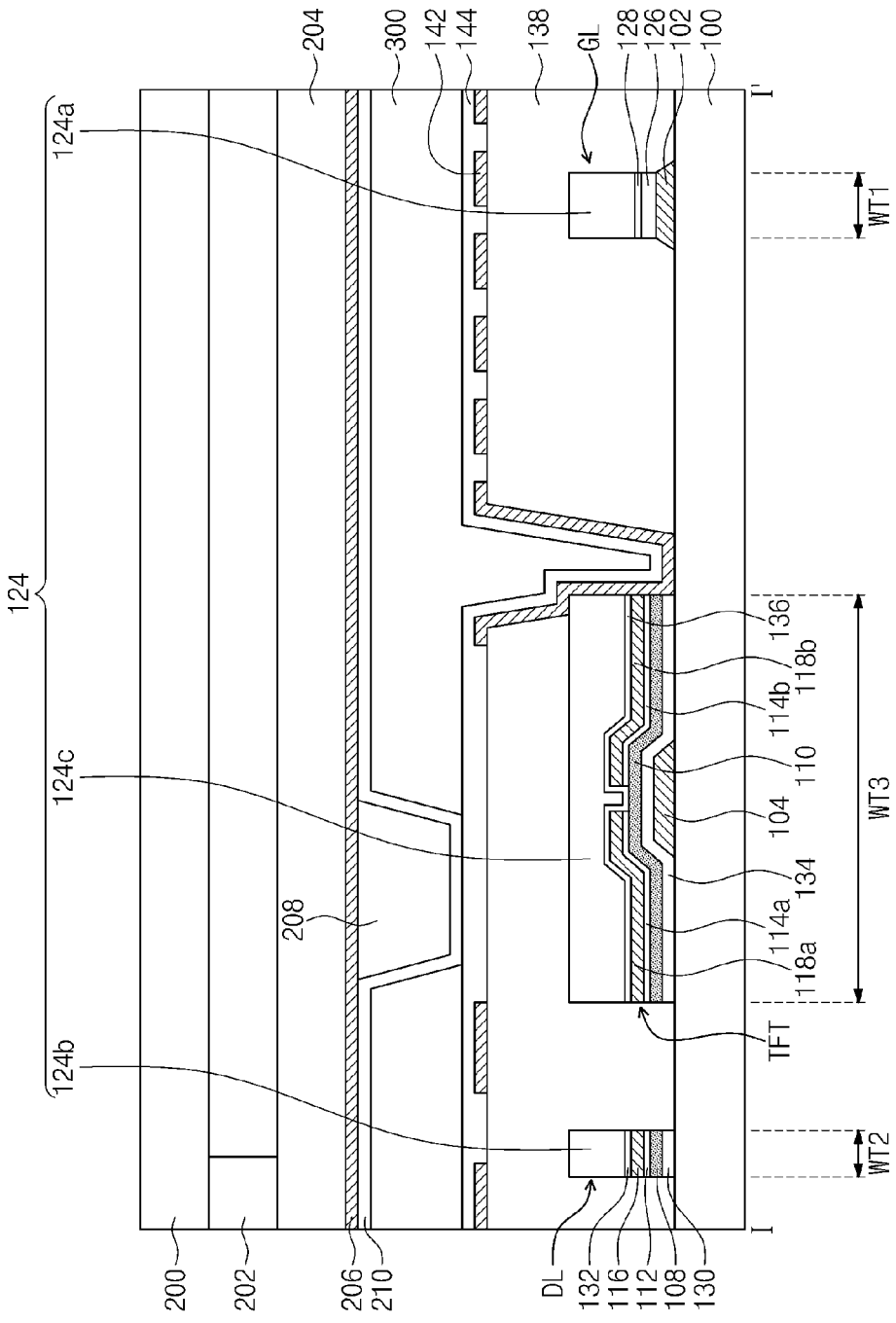

FIGS. 5A through 5R are sectional views of a display device at various stages of manufacture, according to exemplary embodiments.

Referring to FIG. 5A, a gate line 102 and a gate electrode 104 are formed on a transparent a first substrate 100. More specifically, a first conductive layer (not shown) may be first formed on the substrate. The first conductive layer may include at least one of metallic materials, such as Mo, Al, Al—Ni alloy, Mo—W alloy, Cr, and Cu. The first conductive layer may then be patterned to form the gate line 102, and the gate electrode 104 branched from the gate line 102.

Each of the gate line 102 and the gate electrode 104 has a sloping side. The gate line 102 and the gate electrode 104 may have a width gradually decreasing from bottom to top. Here, the width of the top of the gate line 102 is defined as a first width WT1.

Since the first conductive layer is formed of a metallic material as described above, light or ultraviolet light may not pass through portions in which the first gate line 102 and the gate electrode 104 are formed, although the first substrate 100 is transparent.

Referring to FIG. 5B, a first dielectric layer 106 is formed on the substrate 100, the gate line 102, and the gate electrode 104. The first dielectric layer 106 may include at least one of a silicon nitride (SiN$_x$), an oxide, and an oxynitride.

Referring to FIG. 5C, a first conductive pattern 108 of a data line structure DL and an active pattern 110 of a thin film transistor TFT are formed on the first dielectric layer 106. More specifically, a second conductive (not shown) may be first formed on the first dielectric layer 106. The second conductive layer may include amorphous silicon. The second conductive layer may then be patterned to form the first conductive pattern 108 of the data line structure DL and the active pattern 110 of the thin film transistor TFT.

Referring to FIG. 5D, a data line 116 is formed on the first conductive pattern 108 of the data line structure DL, and a source electrode 118a and a drain electrode 118b are formed on the active pattern 110 of the thin film transistor TFT. More specifically, a third conductive layer (not shown) may be first formed on the first conductive pattern 108 of the data line structure DL, the active pattern 110 of the thin film transistor TFT, and the first dielectric layer 106. The third conductive layer may include at least one of metallic materials such as Mo, Al, Al—Ni ally, Mo—W alloy, Cr, and Cu. The third conductive layer may then be patterned to form each of the data line 116, the source electrode 118a, and the drain electrode 118b. The source electrode 118a may be formed such that it is branched from the data line 116.

Since the third conductive layer is formed of a metal-containing material as described above, light or ultraviolet light may not pass through parts in which the data line 116, the source electrode 118a, and the drain electrode 118b are formed.

According to an exemplary embodiment of the inventive concept, seen from the sectional view, the source electrode 118a includes a first end and a second end, and likewise, the drain electrode 118b includes a first end and a second end. The first end of the source electrode 118a and the first end of the drain electrode 118b face each other.

Since the second conductive layer includes amorphous silicon and the third conductive layer includes at least one of metallic materials, a straight-line distance between both ends of the active pattern 110 of the thin film transistor TFT may be greater than a straight-line distance between the second end of the source electrode 118a and the second end of the drain electrode 118b, e.g., a third width WT3. A straight-line distance between both ends of the first conductive pattern 108 of the data line structure DL may be greater than a straight-line distance between both ends of the data line 116, e.g., a second width WT2.

A second conductive pattern 112 may be further formed between the first conductive pattern 108 and the data line 116 of the data line structure DL, and first and second highly doped silicon patterns 114a and 114b may be formed between the active pattern 110 and the source and drain electrode 118a and 118b of the thin film transistor TFT, respectively. The second conductive pattern 112 of the data line structure DL may have substantially the same width as the second width WT2. The first highly doped silicon pattern 114a includes a first end and a second end, and the second highly doped silicon pattern 114b includes a first end and a second end. The first end of the first highly doped silicon pattern 14A and the first end of the second highly doped silicon pattern 114b face each other. A straight-line distance between the second end of the first highly doped silicon pattern 114a and the second end of the second highly doped silicon pattern 114b may be substantially equal to the third width WT3.

Referring to FIG. 5E, both ends of the active pattern 110 exposed at the second end of the source electrode 118a and the second end of the drain electrode 118b, and both ends of the first conductive pattern 108 of the data line structure DL to be exposed at both sides of the data line 116 may be etched.

By the etching process, each side of the active pattern 110 may be substantially coplanar with the second end of the source electrode 118a and the second end of the drain electrode 118b. Transistor characteristics may be improved in the case that the active pattern 110 does not protrude over the ends of the source electrode 118a and the drain electrode 118b, compared to the case that the active pattern 110 protrude than the ends of the source electrode 118a and the drain electrode 118b. Therefore, stains of the display device may be reduced.

Both ends of the second conductive pattern 112 of the data line structure DL and both ends of the first and the second highly doped silicon patterns 114a and 114b of the thin film transistor TFT may also be etched.

This etching process may be omitted. When following processes are performed without the above etching process, the display device described in FIG. 3 may be manufactured.

Referring to FIG. 5F, a second dielectric layer 120 and a black matrix layer 122 may be sequentially formed on the data line 116, the source electrode 118a, the drain electrode 118b, and the first dielectric layer 106.

The second dielectric layer 120 may include silicon nitride. The black matrix layer 122 is formed on the second dielectric layer 120, and then the top surface of the black matrix layer may be leveled out. The black matrix layer 122 may include a positive type photoresist.

Referring to FIG. 5G, a black matrix pattern 124 is formed on the second dielectric layer 120. More specifically, the first substrate 100 is irradiated with ultraviolet light from a side of a second surface the first substrate 100 which is opposing to the first surface of the first substrate 100. The ultraviolet light is unable to penetrate the gate line 102, the data line 116, the gate electrode 104, the source and drain electrodes 118a and 118b which are formed of substances containing a metal. The ultraviolet light passing through portions except for the gate line 102, the data line 116, the gate electrode 104, and the source and drain electrode 118a and 118b, may be radiated to exposed parts of the black matrix layer 122. The exposed parts of the black matrix layer 122 irradiated with the ultraviolet light may be formed into the black matrix pattern 124 through developing and curing process.

The black matrix pattern 124 includes a first region 124a formed on the gate line 102, a second region 124b formed on the data line 116, and a third region 124c formed on the source and drain electrodes 118a and 118b of the thin film transistor TFF.

As described above, the first region 124a of the black matrix pattern is a region that is masked by the gate line 102, and thus, seen from the sectional view, the first region 124a of the black matrix pattern may have substantially the same width as the width of the gate line 102. Here, the width of the gate line 102 is gradually reduced from bottom to top, and light may be partially transmitted through edges of the gate line 102 having a relatively small thickness during the exposure process. Therefore, the first region 124a of the black matrix pattern has a first width WT1 which is substantially equal to the width of the top of the gate line 102.

The second region 124b of the black matrix pattern is a region that is masked by the data line 116, and thus, seen from the sectional view, the second region 124b of the black matrix pattern may have a second width WT2 which is substantially equal to the width of the data line 116.

The third region 124c of the black matrix pattern is a region that is masked by the gate electrode 104, the source electrode 118a and the drain electrode 118b, and thus, seen from the sectional view, the third region 124c of the black matrix pattern may have substantially the same width as the third width WT3.

The exposure time of the ultraviolet light radiated to the black matrix layer 122 may be controlled to adjust the width of the black matrix pattern 124. When the black matrix layer 122 is overexposed to ultraviolet light, the black matrix pattern 124 of the display device illustrated in FIG. 4 may be manufactured.

Referring to FIG. 5H, the first and the second dielectric layers 106 and 120 may be etched using the black matrix pattern 124 as an etching mask, thereby patterning a gate line structure GL, a data line structure DL, and a thin film transistor TFT. More specifically, anisotropic etching process may be performed on the first and the second dielectric layers 106 and 120 using the black matrix pattern 124 as an etching mask. Here, the anisotropic etching process may include dry etching process.

Through the etching process, in the region of a gate line structure GL masked by the first region 124a of the black matrix pattern, a first dielectric pattern 126 and a second dielectric pattern 128 may be formed in sequence on the gate line 102, so that the gate line structure GL is patterned.

In the region of a data line structure DL masked by the second region 124b of the black matrix pattern 124, a first dielectric pattern 130 may be formed between the first substrate 100 and the first conductive pattern 108, and a fourth dielectric pattern 132 may be formed between the data line 116 and the second region 124b of the black matrix pattern 124, so that the data line structure DL is patterned.

In the region of the thin film transistor TFT masked by the third region 124c of the black matrix pattern 124, a gate dielectric pattern 134 may be formed between the gate electrode 104 and the active pattern 110, and a passivation pattern 136 may be formed between the source and drain electrode 118a and 118b and the third region 124c of the black matrix pattern 124, so that the thin film transistor TFT is patterned.

Therefore, the first and the second dielectric layers 106 and 120 may be etched using the black matrix pattern 124 as an etching mask, and thus an additional mask forming process is not required, thereby improving manufacturing efficiency.

Referring to FIG. 5I, an organic layer 138 may be formed completely covering the gate line structure GL, the data line structure DL, the thin film transistor TFT, and the black matrix pattern 124. The organic layer 138 may be made of an acrylic resin having photosensitivity.

In case of a COA type display device, a color filter 150 may be formed instead of the organic layer 138. Furthermore, a capping layer 152 may be conformably formed on the color filter 150.

Referring to FIG. 5J, a hole 140 exposing at least a portion of the drain electrode 118b is formed by etching the organic layer 138. A second end of the drain electrode 118b may be exposed by the hole 140. The hole 140 may extend to expose at least a portion of a first surface of a substrate 100.

Referring to FIG. 5K, a pixel electrode 142 electrically connected with the drain electrode 118b is formed on the organic layer 138. According to an exemplary embodiment, the pixel electrode 142 may include a plurality of micro slits which divide a pixel region into a plurality of domains.

Referring to FIG. 5L, a first alignment layer 144 may be conformably formed on the pixel electrode 142.

Referring to FIG. 5M, a color filter 202 is formed on a first surface of a second substrate 200. The color filter 202 may be formed according to each color in each pixel region. In case of a COA type display device in FIG. 2, this process may be omitted.

Referring to FIG. 5N, since the color filters 202 may have different thicknesses according to the corresponding color, an over coating layer 204 may be formed to compensate for step differences caused by the thickness differences.

Referring to FIG. 5O, a common electrode 206 may be formed on the over coating layer 204. The common electrode 206 may have a plate-shaped structure. On the common electrode 206, a column spacer 208 may be formed to secure a space to fill in a liquid crystal layer 300 between the first and the second substrates 100 and 200.

Referring to FIG. 5P, a second alignment layer 210 may be formed on the second substrate 200, the common electrode 206, and the column spacer 208.

Referring to FIG. 5Q, a first surface of the first substrate 100 on which the gate line structure GL, the data line structure DL, the thin film transistor TFT, the black matrix pattern 124, the organic layer 138, the pixel electrode 142, and the first alignment layer 144 are formed, and a first surface of the second substrate 200 on which the color filter 202, the over coating layer 204, the common electrode 206, the column spacer 208, and the second alignment layer 210 are formed, are attached to each other, facing each other. A space between the first and the second substrates 100 and 200 may be secured by the column spacer 208.

Referring to FIG. 5R, a crystal liquid layer 300 may be injected into the space between the first and the second substrates 100 and 200 to manufacture a display device.

According to exemplary embodiments, the transmittance of a display device may be improved by removing first and second dielectric layers formed in the region in which a gate line structure, a data line structure, and a thin film transistor are not formed. Also, the first and the second dielectric layer may be etched using the black matrix pattern as an etching mask, and, therefore, an additional mask forming process is not required, which may be more efficient in terms of cost and processing time.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
   a gate line structure disposed on a substrate, the gate line structure comprising a gate line and a first dielectric pattern sequentially stacked on the substrate;
   a data line structure disposed on the substrate, the data line structure comprising a first dielectric pattern, a first conductive pattern, and a data line sequentially stacked on the substrate;
   a thin film transistor disposed on the substrate, the thin film transistor comprising a gate electrode, a gate dielectric pattern, and an active pattern sequentially stacked on the substrate, the thin film transistor further comprising source and drain electrodes disposed on the active pattern; and
   a black matrix pattern comprising:
   a first region disposed directly on the gate line structure;

a second region disposed directly on the data line structure; and a third region disposed directly on the thin film transistor, wherein lateral dimensions of the first region of the black matrix pattern, top of the gate line and the first dielectric pattern of the gate line structure are substantially equal to one another, wherein lateral dimensions of the second region of the black matrix pattern, the data line and the first dielectric pattern of the data line structure are substantially equal to one another, and wherein lateral dimensions of the third region of the black matrix pattern and the gate dielectric pattern are substantially equal to one another.

2. The device of claim 1, wherein:

lateral dimensions of the gate dielectric pattern and the active pattern are substantially equal to one another.

3. The device of claim 1, wherein:

lateral dimensions of the first conductive pattern of the data line structure and the second region of the black matrix pattern are substantially equal to one another; and lateral dimensions of the active pattern and the third region of the black matrix pattern are substantially equal to one another.

4. The device of claim 1, wherein:

a lateral dimension width of the first conductive pattern of the data line structure is greater than a lateral dimension of the second region of the black matrix pattern; and a lateral dimension of the active pattern is greater than a lateral dimension of the third region of the black matrix pattern.

5. The device of claim 1, wherein:

the gate line structure further comprises a second dielectric pattern disposed between the first dielectric pattern of the gate line structure and the first region of the black matrix pattern;

the data line structure further comprises a second dielectric pattern disposed between the data line and the second region of the black matrix pattern; and the thin film transistor further comprises a passivation pattern disposed between the source and drain electrodes and the third region of the black matrix pattern.

6. The device of claim 5, wherein:

lateral dimensions of the second dielectric pattern and the first region of the black matrix pattern are substantially equal to one another;

lateral dimensions of the second dielectric pattern of the data line structure and the second region of the black matrix pattern are substantially equal to one another; and lateral dimensions of the passivation pattern and the third region of the black matrix pattern are substantially equal to one another.

7. The device of claim 1, further comprising:

an organic layer covering the black matrix pattern, the organic layer comprising a hole exposing the drain electrode; and a pixel electrode electrically connected to the drain electrode exposed via the hole.

8. The device of claim 1, further comprising:

a color filter covering the black matrix pattern, the color filter comprising a hole exposing the drain electrode; and a pixel electrode electrically connected to the drain electrode via the hole.

9. The device of claim 1, wherein each of the gate line, the gate electrode, the data line, the source electrode, and the drain electrode comprises at least one metallic material.

* * * * *